United States Patent [19]

Demaray

[11] Patent Number: 4,676,994

[45] Date of Patent: Jun. 30, 1987

[54] ADHERENT CERAMIC COATINGS

[75] Inventor: Richard E. Demaray, Oakland, Calif.

[73] Assignee: The Boc Group, Inc., Montvale, N.J.

[21] Appl. No.: 717,581

[22] Filed: Mar. 28, 1985

Related U.S. Application Data

[63] Continuation of Ser. No. 504,651, Jun. 15, 1983.

[51] Int. Cl.$^4$ .................... B05D 3/06; C23C 11/00
[52] U.S. Cl. .................... 427/42; 427/248.1; 427/255.3; 427/257; 427/258
[58] Field of Search ............ 427/42, 248.1, 255.2, 427/255.3, 257, 258

[56] References Cited

U.S. PATENT DOCUMENTS

| | | | |
|---|---|---|---|
| 4,172,156 | 10/1979 | Ritter et al. | 427/42 |
| 4,177,093 | 12/1979 | Feng et al. | 427/42 |
| 4,238,525 | 12/1980 | Aichert et al. | 427/42 |
| 4,305,801 | 12/1981 | Patten et al. | 204/192 R |
| 4,321,310 | 3/1982 | Ulion et al. | 428/612 |
| 4,321,311 | 3/1982 | Strangman | 428/623 |
| 4,405,659 | 9/1983 | Strangman | 427/248.1 |
| 4,414,249 | 11/1983 | Ulion et al. | 427/248.1 |

OTHER PUBLICATIONS

R. F. Bunshah, "Structure/Property Relationships in Evaporated Thick Films and Bulk Coatings", J. Vac. Sci. Technol., vol. 11, No. 4, Jul./Aug. 1974.

*Primary Examiner*—John E. Kittle
*Assistant Examiner*—James J. Seidleck
*Attorney, Agent, or Firm*—David A. Draegert; Larry R. Cassett

[57] ABSTRACT

A method for depositing a coating of a dense ceramic material is disclosed. The coating may be an oxide or other refractory ceramic material. A ceramic starting material is melted and refined by heating with an electron beam in vacuum. The refined material is evaporated and deposited on a heated substrate to form a dense ceramic coating. In particular, a durable ceramic thermal barrier coating on a superalloy turbine part may be formed by coating the part with a metal layer which is oxidized to form alumina and depositing a dense ceramic layer followed by an overcoating of a columnar ceramic material.

17 Claims, 3 Drawing Figures

ADHERENT CERAMIC COATINGS

This is a continuation of Ser. No. 504,651, filed June 15, 1983.

FIELD OF THE INVENTION

The invention is in the field of ceramic coatings on substrates. The substrates may be metal or nonmetal, homogenous or composite materials. The invention has particular application for protective coatings for turbine engine components. Significant improvements in durability and high temperature capability of combustion zone parts are possible.

BACKGROUND ART

U.S. Pat. No. 4,321,311 to Strangman describes a composite coating system for thermal barrier ceramic coatings on metal parts. The system has three interrelated elements. (1) a metallic layer of an alumina forming metal, such as MCrAlY alloy where M is Ni, Co, NiCo, Fe or other metals, (2) a continuous adherent alumina layer formed on the metallic layer, and (3) a discontinuous ceramic layer having a particular columnar morphology on the alumina layer.

The ceramic layer has columnar grains, oriented substantially perpendicular to the surface of the substrate and having free surfaces extending down to the alumina layer. The voids between the individual ceramic columns enlarge and diminish to accommodate strains arising because of the differential thermal expansion between the metallic and ceramic materials.

This patent teaches deposition cf the columnar ceramic coating by positioning the substrate over an electron-beam heated pool of molten ceramic in vacuum. The substrate temperature was maintained in the range 1000° to 1500° F. to provide a relatively coarse columnar structure. In order to assure that the ceramic coating contained the stoichiometric amount of oxygen, the dark, as-deposited ceramic was heat treated at about 1600° F. for 32 hours in an oxygen containing atmosphere so that the color lightened to a shade typical of the stoichiometric ceramic.

A closely related U.S. Pat. No. 4,321,310 to Ulion and Ruckle, teaches polishing of the interface between the metallic layer and the alumina layer to provide a surface roughness of less than about 25 microinches RMS average. This increases the adherence of the columnar ceramic layer and, thus, increases the cyclic temperature durability of the coating system.

The prior art also teaches the deposition of ceramic materials, such as yttria, by electron-beam heated evaporation of a metal or alloy vapor in the presence of oxygen. See, for example, R. F. Bunshah, "Structure/property relationships in evaporated thick films and bulk coatings", J. Vac. Sci. Technol. Vol. 11, p. 633-39, July/Aug 1974.

SUMMARY OF THE INVENTION

In the present invention, a layer of dense substoichiometric ceramic material is deposited on a substrate. The coating may be an oxide, nitride, carbide, boride, silicide or other refractory ceramic material. A ceramic starting material is refined and probably chemically reduced by heating with an electron beam in vacuum. This material becomes substoichiometric because of the evolvement of oxygen, nitrogen or other reactive gas. The refined, substoichiometric material is then evaporated in vacuum and deposited on a heated substrate to form a dense, substoichiometric ceramic layer.

The object to be coated may be a metal or non-metal, but for proper adherence it must have a stable ceramic surface which is chemically and mechanically compatible with the ceramic coating to be applied. In the case of a metal object, the object may be covered with ceramic-forming metal layer which is then converted to a ceramic layer by heating the object in an atmosphere containing the appropriate reactive gas. In particular, for a superalloy turbine part, the object may be coated with an alumina forming layer and heated in a residual air atmosphere.

If desired, an overcoating of columnar, substantially stoichiometric ceramic material can be formed by reactively depositing a ceramic vapor in the presence of oxygen or other reactive gas component of the ceramic.

DESCRIPTION OF THE PREFERRED EMBODIMENTS

Figure 1:
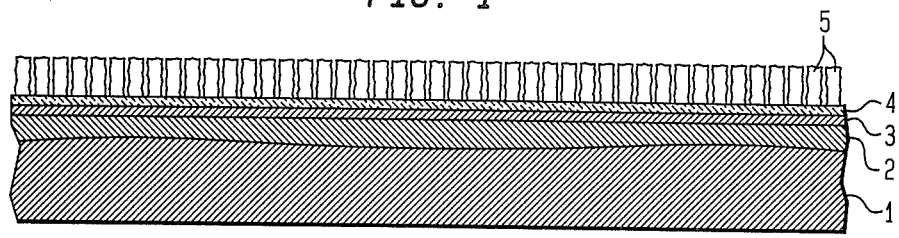
FIG. 1 is a cross-sectional line drawing illustrating a coating system according to the invention.

FIG. 1 illustrates a coating system for a metal part according to the invention. The base material 1 is coated with an alumina forming metallic layer 2 on which an alumina containing oxide layer 3 is formed. The layer of dense ceramic material 4 is formed on the oxide layer 3, and the columnar, substantially stoichiometric ceramic material 5 is formed on the dense ceramic layer. The density of the material of layer 4 is preferably greater than 94%, typically 96%, of the maximum theoretical density of the ceramic material. Open porosity typically disappears at about 94% theoretical density. The latter is about 6 g/cm$^3$ for zirconia stablilized with 20 weight percent yttria ($ZrO_2$ with 20% $Y_2O_3$). The density of the columnar ceramic material 5 is typically 50 to 90% of the theoretical maximum value.

Figure 2:
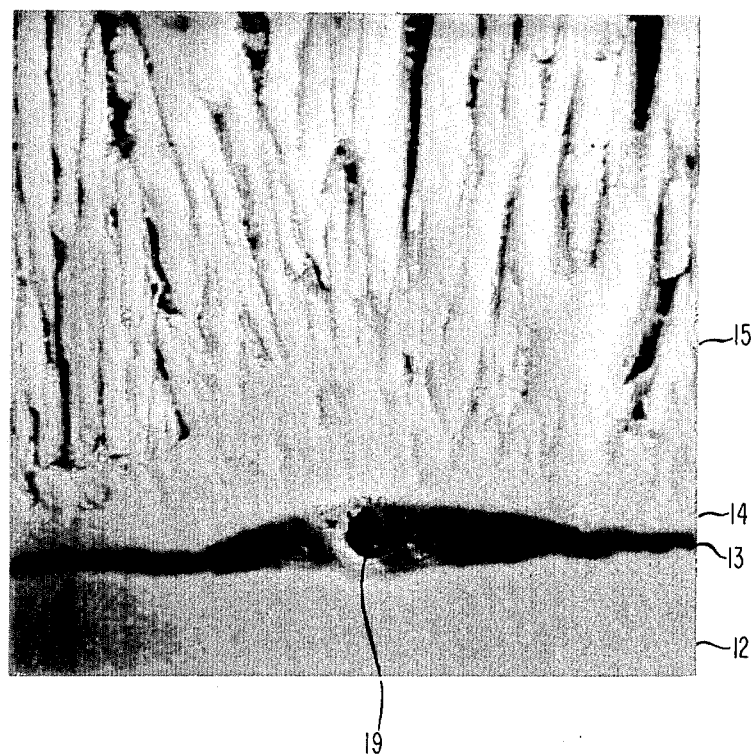
FIG. 2 is a scanning electron microscope photomicrograph (approximately 5000× magnification) showing a cross section of a sample of an experimental coating system according to the invention.

FIG. 2 is a scanning electron microscope photomicrograph showing a polished cross-sectional sample of a coating system of the type illustrated in FIG. 1. The base material is a superalloy which was polished to surface roughness 40 to 50 micrometers (15 to 20 microinches) RMS and coated with a layer 12 of NiCrAlY on which an alumina containing oxide layer 13 was formed. The nominal NiCrAlY composition was Ni (remainder), 22% Cr, 12% Al, and 0.3% Y. The dense ceramic material 14 and the columnar ceramic material 15 are both $ZrO_2$ with 20% $Y_2O_3$. Note that the layer of dense ceramic material 14 bridges over the surface defect 19 caused by a spit of $ZrO_2$ or $Y_2O_3$ from the coating source.

A preferred process for depositing a ceramic coating on a metallic substrate will now be described. Typically, the base article is composed of a metal alloy, such as stainless steel 302, or Inconel 718, or a superalloy, such as Ni or Co base, Cr containing alloys, known as Waspalloy, MAR-M-247 or PWA 1455. The surface is polished, preferably to a surface roughness of 10 to 250 nm(0.5 to 10 microinches) RMS average. The polishing may be accomplished by mechanical grinding and polishing, perhaps in conjunction with abrasive slurry or electrochemical polishing techniques. The polished surface is cleaned by appropriate processes, such as vapor honing and ultrasonic techniques.

The polished article is coated with a metallic layer of an alumina ($Al_2O_3$) forming material, such as Al, $Ni_3Al$ or MCrAlY, by an appropriate process. This may be done by physical vapor deposition, low pressure plasma spray, sputtering, or pack diffusion. This metallic coating typically has a thickness of 0.12 mm (0.005 inches), but thicknesses in the range from 0.5 micrometers to 10 mm ($2 \times 10^{-5}$ to 0.5 inches) may be appropriate depending upon the application. In addition, intermediate layers between the alumina forming metal coating and the metal base may be used.

The coated base is glass bead peened in a conventional manner, preferably with new glass beads at a pressure of 0.3 to 0.4 MPa (50 to 60 pounds per square inch). The part is then thoroughly cleaned ultrasonically and degreased, preferably in a flurocarbon liquid which does not contain a drying agent.

The part is mounted on an appropriate fixture and introduced into a first chamber or load lock of a vacuum coating system. The load lock is evacuated to a suitable pressure, such as less than $10^{-3}$ torr. Radiant or electron beam heaters preheat the article and maintain its temperature at a value between 870° and 1100° C. (1600° and 2000° F.) for a time between 10 and 30 minutes so as to dry, degas, and evaporatively clean the surface. During this time, the alumina forming material is oxidized to form a layer of mixed metal oxides having a typical thickness of 0.5 to 2 micrometers. Of course, if the alumina forming material 12 is simply Al, the alumina containing layer 13 is just alumina and not mixed metal oxides.

Figure 3:
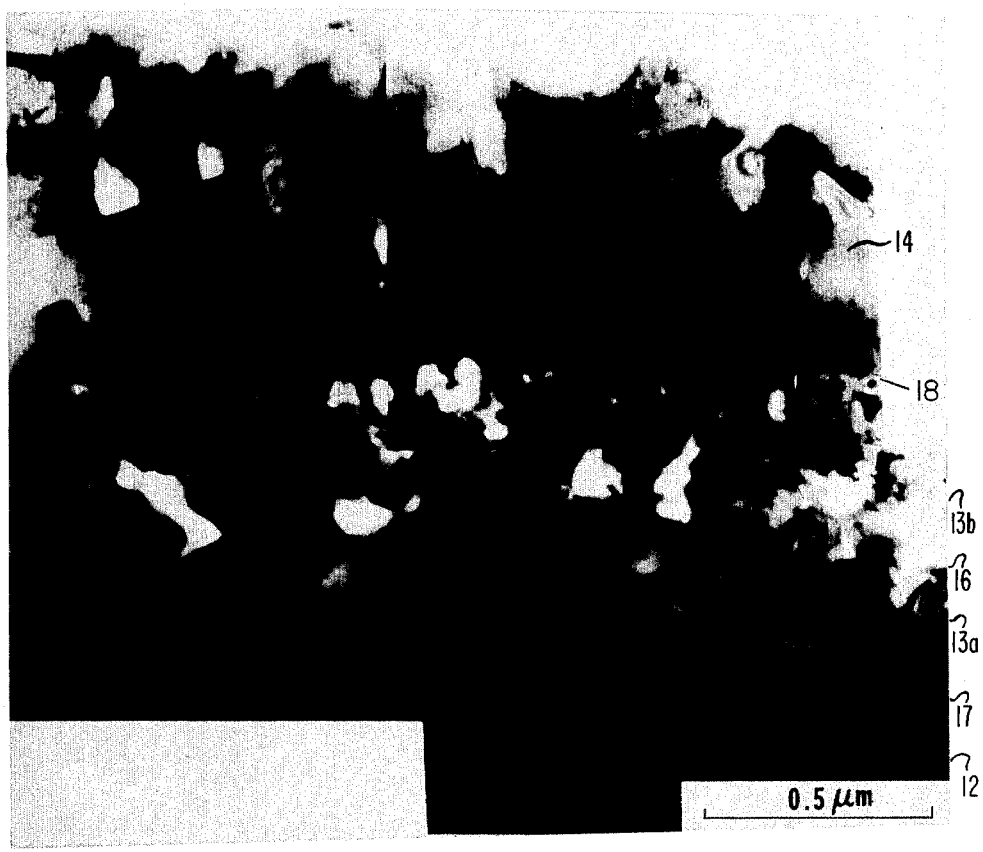
FIG. 3 is a composite of four transverse electron microscope photomicrographs showing a cross section of a sample of an experimental coating system. The scale is indicated in the figure.

FIG. 3 illustrates the possible complexity of the alumina containing oxide layer 13 of the sample of FIG. 2. It is believed that when oxidation begins, a porous layer of mixed metal oxides forms on the surface 17 of the layer 12 of the alumina forming metal coating. The various metal components of the mixed oxides are in approximately the same relative quantities as in the metal layer 12. As oxidation continues, aluminum oxide grains form and grow until they form a continuous, dense alumina layer 13a having a thickness of 0.25 to 0.5 micrometers. The continuous alumina layer forms an oxygen barrier and stops further oxidation. The dense alumina and the porous metal oxide layers have a definite interface 16. The dense zirconia layer 14 is deposited directly on the surface 18 of the remaining porous layer 13b of mixed metal oxides.

The ceramic material to be vaporized is heated by an electron beam in a chamber which is constantly pumped to evacuate it. The material is melted in a crucible and brought to a temperature where it is refined and probably chemically reduced. The appropriate temperature range depends upon the material and is not known precisely. For $ZrO_2$ stabilized with 20 weight percent $Y_2O_3$, the preferred temperature is believed between 1800° and 2000° C. (3270° and 3630° F.). A suitable operating temperature is obtained by setting the electron beam power just below that which produces rapid evaporation. A radiant heater is used to heat the walls and outgas the chamber. The refining and reducing step is continued for several minutes until a quantity of substoichiometric ceramic material is produced near the heated surface. This may be indicated by a reduction in the system pressure to a low value, such as $5 \times 10^{-5}$ torr, as the quantity of oxygen or other reactive gas evolved from the material declines. The substoichiometric ceramic liquid is black and glassy and has a high density, believed greater than about 96% of the theoretical maximum for the ceramic material. Enough of the dense substoichiometric material must be available to provide a dense layer of the desired thickness on the substrate. A vapor shield or shutter covers the crucible until coating actually begins.

The part to be coated is transferred into the evacuated chamber and positioned over the covered crucible at an appropriate distance. The substrate is rotated at a rate, preferably greater than 10 revolutions per minute (rpm). The substrate temperature is maintained at a value between 900° and 1200° C. (1650° and 2200° F.) by a radiant or other heater. The chamber pressure is preferably $10^{-4}$ torr or less. A pressure of less than $2 \times 10^{-5}$ torr is even more preferred. When all is ready, the electron beam power is increased to a value which provides rapid evaporation. A coating deposition rate of between 10 nm/min. and 25 micrometers/min. is preferred. A rate of 500 nm/min. or less is preferred for maximum density.

When coating is to begin, the crucible is uncovered and the part is exposed to the substoichiometric vapor for a length of time suitable to provide a layer of dense ceramic coating having the desired thickness. This thickness must be sufficient to provide a continuous covering of the substrate surface, but less than the thickness which would yield a residual stress of formation greater than the strength of the ceramic coating or the strength of the ceramic coating-substrate interface. At minimum radius of curvature, the thickness of the dense ceramic coating is preferably less than about 10 times the minimum radius of curvature. Minimum radii of curvatures of 12 micrometers to 1.2 mm (0.0005 to 0.05 inches) are frequently used in turbine engine components. For maximum thermal cycle durability the thickness is preferably 2 to 10 times greater than the RMS average surface roughness of the substrate. Useful coating thicknesses of between 1 nm and 10 mm appear possible.

After the dense substoichiometric layer is formed, oxygen is introduced into the coating chamber to maintain a suitable pressure, preferably between 0.5 and 2 millitorr, but pressures in the range 0.1 to 10 millitorr may be useful at times. Tubes and nozzles are used to direct the oxygen gas to impinge upon the substrate. Use of an automatic flow valve is preferred in order to maintain precise control. The pressure of all other gases is preferably less than 10% of the total pressure. Introduction of oxygen gas increases the oxygen content of the dense ceramic layer and initiates formation of a columnar, substantially stoichiometric ceramic. The oxygen flow rate is proportional to the rate of deposition. The substrate temperature is preferably maintained at a constant value in the range of 540° to 1200° C. (1000° to 2200° F.). The electron beam power and substrate rotation rates are comparable to those for depositing the dense ceramic layer.

When the desired thickness of columnar ceramic has been obtained, the vapor source is covered, the electron beam power is reduced, the oxygen flow is halted, and the substrate heater turned off. The coated article is withdrawn into the load lock and cooled to approximately 150° C. (300° F.) before it is removed from the vacuum system. Increased adhesion can be obtained by annealing the coated part from 10 minutes to several hours in an air furnace at a temperature 55° to 280° C. (100° to 500° F.) above the temperature maintained during formation of the columnar ceramic.

The density of the ceramic layers increases with the substrate temperature during deposition and decreases as the deposition rate increases. It has been observed that the ratio of coating density to theoretical maximum density increases almost linearly as the substrate rotation rate increases from 10 to 50 rpm. Reciprocal and other types of substrate motion are possible. An average substrate speed of greater than 76 cm/min. (30 inches per minute) is preferred for uniformity and maximum density.

The specific electron beam powers necessary for refining and deposition depends upon many factors but are easily determined by experiment. For $ZrO_2$ in a circular cruciable 10 cm (4 inches) in diameter where the onset of rapid evaporation is typically about 12 kW, refining is done at about 10 kW and deposition at about 20 kW.

Dense ceramic layers deposited according to the invention have an extremely fine grain size. As is indicated in FIG. 3, the grains have an initial average width perpendicular to the growth direction of less than about 100 nm. Such small grain sizes are preferred for maximum adherence to the substrate. In known prior ceramic layers, the initial average width is typically 500 nm or more.

EXAMPLE 1

A ceramic coating was applied to a first-stage turbine blade for a gas turbine engine. The superalloy blade was approximately 10×4×4 cm (4×1.5×1.5 inches) in size and had an airfoil region to be coated having a radii of curvature ranging down to about 25 micrometers (0.001 inches). The part was cleaned by a vapor honing process and coated with a layer of CoCrAlY by a conventional electron-beam heated evaporation process similar to that described in U.S Pat. No. 3,798,055. The CoCrAlY coating had a nominal thickness of 0.12 mm (0.005 inches) and a nominal composition of Co (remainder), 21% Cr, 12% Al, and 0.3% Y.

After application of the CoCrAlY coating, the part was glass bead peened and then heat treated in a dry hydrogen atmosphere at a temperature of 980° C. (1800° F.).

After these preliminary steps, the part had an average surface roughness of approximately 0.001 mm (60 microinches) RMS average on the curved surfaces which were to be coated.

The part was fixtured on a rotatable shaft and introduced into a load lock which was then evacuated to a pressure of approximately $2 \times 10^{-4}$ torr. The part was introduced into a vacuum furnace chamber and rotated at 12 rpm while it was heated by a radiant heater to a temperature of about 980° C. (1800° F.) for about 10 minutes to form a 1 to 2 micrometer thick layer of alumina containing metal oxide on the surface. During this time, a compressed ingot of white, porous pellets of $ZrO_2$ stabilized by 20 weight percent $Y_2O_3$ was melted and refined in an electron beam in a circular crucible having a diameter of 10 cm (4 inches) positioned about 20 cm (8 inches) below the part. The pressure in the furnace chamber was about $2 \times 10^{-4}$ torr and a radiant heater over the crucible heated a witness substrate to about 980° C. (1800° F.). The electron beam power was just below that for the onset of rapid evaporation. To begin coating, the electron beam power was increased to about 30 kW and the crucible uncovered to expose the rotating part to the vapor. The part was coated for approximately 90 seconds to deposit a dense, substoichiometric ceramic layer having an estimated thickness of approximately 45 micrometers.

After 90 seconds, oxygen was introduced into the chamber to provide a partial pressure of between 0.5 and 1 millitorr. The part continued to rotate at approximately 12 rpm for approximately 30 minutes so as to deposit a columnar ceramic layer having a thickness of approximately 0.1 mm (0.005 inches). The finished part was returned to the load lock and cooled before being removed from the vacuum system.

This part was tested for cyclic heating and cooling by moving it into and out of an air furnace maintained at about 1000° C. (1830° F.) with a cycle time of 10 minutes. The part survived approximately 500 cycles with no spauling or delamination before failure occurred.

Other parts were coated by a similar process except that the duration of the time of the exposure of the part to the substoichiometric vapor before the introduction of oxygen into the chamber was varied from about 3 to 90 seconds. The results of thermal cycle testing of these parts is shown in Table I.

TABLE I

| Run # | Substoichiometric Coating Time | Thermal Cycles to Failure |
|---|---|---|
| 157,166 | 3 sec. | 0 |
| 160 | 19 | 161* |
| 161 | 19 | 2016 |
| 159 | 43 | 500 |
| 165 | 60 | 432 |
| 158 | 90 | 500 |
| 164 | Entire | 1 |

*Equipment failure

The thickness of the dense layer is determined by the length of time of exposure to the substoichiometric ceramic vapor before introduction of the reactive gas. From the data of Table I, it is clear that the optimum time was approximately 19 seconds under the conditions prevailing. This corresponded to a thickness of approximately 10 micrometers for the dense, substoichiometric layer.

EXAMPLE 2

A part similar to those of Example 1 was coated by a process similar to that of Example 1 except that it was not heat treated in dry hydrogen. The coating interval before oxygen gas was introduced was 19 seconds, the approximate optimum value determine from Table 1. This part survived 4000 cycles of the thermal test.

Non-metallic substrates may also be coated. The substrate may be elemental, such as carbon graphite; single crystalline ceramic, such as sapphire or silicon nitride; polycrystalline ceramic, such as quartz or alumina; or an amorphous material, such as glassy $SiO_2$ or boroalumina silicates. Dense ceramic coatings of $Al_2O_3$, SiN and $SiO_2$ have been applied to ceramic substrates.

The surface of a ceramic substrate is preferably polished to a surface finish that is limited by the homogeniety of the substrate material. This can be done by the processes mentioned in the case of metallic substrates or by fire polishing in an inert or reactive media, or by reactive ion etching. Depending upon the polishing scheme, drying and ultrasonic cleaning may be preferred to remove polishing media or chemical residue. The substrate is mounted on an appropriate fixture, and introduced into a load lock, and heated, by radiant and or electron beam means, for a time between 10 and 30 minutes, preferably to a temperature just below its weakening or melting point. Substrate outgassing may require a longer time. During this time, reactive ion etching or sputtering from the sample may be performed, if required to complete surface preparation. Selective gas reactions or electron beam impingement may also be used to modify the chemical and structural makeup of the substrate surface. Preparation of a special alumina containing layer is generally unnecessary for a non-metallic substrate.

The preferred procedure for depositing the dense, layer is also similar to that described for metallic substrates. For ceramic substrates, the substrate adhesion, density and strength of the dense ceramic coating layer can be improved by depositing at a formation temperature just below the melting point of the substrate or coating, whichever is lower. If desired, the dense ceramic coating can be made substantially stoichiometric or a columnar ceramic overcoat can be made by introducing the appropriate reactive gas following deposition of the dense layer.

The thickness of the dense ceramic layer can be substantially greater on a ceramic substrate than on a metallic substrate because the difference in thermal expansion coefficients of coating and substrate will normally be much less. Hence, dense erosion and abrasion resistant ceramic coatings having thickness of 10 to 100 micrometers can be manufactured which have thermal cycle durability equivalent to much thinner coatings on metallic substrates; thinner by the ratio of the thermal expansion coefficient of the ceramic substrate to that of the metallic substrate. Alternatively, thin dense coatings of 1 to 10 micrometers can be made which have thermal cycle durabilities enhanced by the inverse of this ratio.

What is claimed is:

1. A method of depositing a ceramic coating on a substrate having a ceramic surface, comprising:
   melting and refining a first ceramic material by heating with an electron beam in vacuum to form a substoichiometric ceramic liquid,
   heating the substrate in vacuum to a temperature greater than about 900° C.,
   evaporating the refined ceramic liquid in vacuum, and exposing the heated substrate to the substoichio metric vapor to deposit a dense ceramic layer on the substrate, and
   depositing a layer of columnar ceramic on the dense ceramic layer.

2. The method of claim 1 wherein the dense ceramic layer is deposited in a vacuum at a pressure of $10^{-4}$ torr or less.

3. The method of claim 1 further comprising continuously moving the substrate while it is exposed to the vapor.

4. The method of claim 3 wherein the substrate is rotated at a rate greater than 10 revolutions per minute while it is exposed to the vapor.

5. The method of claim 1 wherein the dense ceramic layer has a density greater than about 94% of the maximum theoretical density of the first ceramic material.

6. The method of claim 1 wherein the thickness of the dense ceramic layer is 2 to 10 times the RMS average roughness of the surface to be coated.

7. The method of claim 6 wherein the RMS average roughness of the surface to be coated in 250 nm or less.

8. The method of claim 1 wherein the substrate surface to be coated is curved and the thickness of the dense ceramic layer is less than 10 times the minimum radius of curvature.

9. The method of claim 8 wherein the minimum radius of curvature is 1.2 mm or less.

10. The method of claim 8 wherein the thickness of the dense ceramic layer is 2 to 10 times the RMS average roughness of the surface to be coated.

11. A substrate coated with a layer of dense ceramic material by the method of claim 1 wherein the initial average dimension perpendicular to the growth direction of grains in the dense ceramic layer is less than 100 nm.

12. A method of depositing a dense ceramic coating on a metal article coated with a layer of an alumina forming material which has been oxidized, comprising:
    melting and refining a first ceramic material by heating with an electron beam in vacuum to form a substoichiometric ceramic liquid,
    heating the substrate in vaccum to a temperature greater than about 900° C.,
    evaporating the refined ceramic liquid in vacuum, and
    exposing the heated substrate to the substoichiometric vapor to deposit a dense ceramic layer on the substrate, and depositing a layer of columnar ceramic on the dense ceramic layer.

13. The method of claim 12, wherein the columnar ceramic layer is deposited by electron-beam heated evaporation of second ceramic material in the presence of oxygen.

14. The method of claim 13 wherein the alumina forming material is MCrAlY where M is Ni, Co, NiCo, or Fe.

15. The method of claim 14 wherein the thickness of the dense ceramic layer is between 500 nm and 10 mm, and the pressure during the deposition of the first ceramic material is less than $2 \times 10^{-5}$ torr.

16. The method of claim 15 wherein the partial pressure of oxygen during the deposition of the columnar ceramic layer is between 0.5 and 2 millitorr and the partial pressure of other gases is less than 10% the total pressure.

17. A substrate coated with a layer of dense ceramic material by the method of claim 16.

* * * * *